US009978556B2

(12) United States Patent
Lee et al.

(10) Patent No.: US 9,978,556 B2
(45) Date of Patent: May 22, 2018

(54) PARALLELIZING ELECTROSTATIC ACCELERATION/DECELERATION OPTICAL ELEMENT

(71) Applicant: Varian Semiconductor Equipment Associates, Inc., Gloucester, MA (US)

(72) Inventors: William Davis Lee, Newburyport, MA (US); Frank Sinclair, Boston, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days. days.

(21) Appl. No.: 14/966,227

(22) Filed: Dec. 11, 2015

(65) Prior Publication Data

US 2017/0169987 A1 Jun. 15, 2017

(51) Int. Cl.
| | |
|---|---|
| *H01J 37/05* | (2006.01) |
| *H01J 37/12* | (2006.01) |
| *H01J 37/08* | (2006.01) |
| *H01J 37/317* | (2006.01) |
| *H01J 37/147* | (2006.01) |

(52) U.S. Cl.
CPC .............. *H01J 37/12* (2013.01); *H01J 37/05* (2013.01); *H01J 37/08* (2013.01); *H01J 37/1477* (2013.01); *H01J 37/3171* (2013.01); *H01J 2237/047* (2013.01)

(58) Field of Classification Search
None
See application file for complete search history.

(56) References Cited

U.S. PATENT DOCUMENTS

| | | | |
|---|---|---|---|
| 5,091,655 A | 2/1992 | Dykstra et al. | |
| 5,177,366 A | 1/1993 | King et al. | |
| 5,780,863 A * | 7/1998 | Benveniste | H01J 37/3007 250/398 |
| 6,774,377 B1 | 8/2004 | Rathmell et al. | |
| 6,777,696 B1 | 8/2004 | Rathmell et al. | |
| 7,112,809 B2 | 9/2006 | Rathmell et al. | |
| 7,456,931 B2 | 11/2008 | De Winter et al. | |
| 7,462,838 B2 | 12/2008 | Sasaki | |
| 7,800,082 B2 * | 9/2010 | Kellerman | H01J 37/05 250/251 |
| 7,888,653 B2 | 2/2011 | Kellerman et al. | |
| 8,129,695 B2 | 3/2012 | Kellerman et al. | |

(Continued)

FOREIGN PATENT DOCUMENTS

JP 5097131 B2 * 12/2012 .......... H01J 37/3007

*Primary Examiner* — Michael Logie

(57) ABSTRACT

Provided herein are approaches for controlling a charged particle beam using a series of electrodes including a plurality of different shapes. In one approach, an electrostatic optical element includes a first set of electrodes having a first electrode shape for parallelizing and deflecting the charged particle beam using a first set of electrodes having a first electrode shape, such as a concave or convex profile. The electrostatic optical element further includes a second set of electrodes adjacent the first set of electrodes for accelerating or decelerating the charged particle beam along a beamline, wherein the second set of electrodes include a cylindrical shape. In one approach, a power supply is electrically connected to the first and second sets of electrodes, the power supply arranged to enable independent voltage/current control.

8 Claims, 7 Drawing Sheets

(56) References Cited

U.S. PATENT DOCUMENTS

| | | | |
|---|---|---|---|
| 2006/0113465 A1* | 6/2006 | Kabasawa | H01J 27/024 250/290 |
| 2006/0113493 A1* | 6/2006 | Kabasawa | H01J 27/024 250/492.21 |
| 2007/0176122 A1* | 8/2007 | Saadatmand | H01J 37/3007 250/492.21 |
| 2008/0035856 A1* | 2/2008 | Yamashita | H01J 37/12 250/398 |
| 2008/0078951 A1* | 4/2008 | Renau | H01J 37/12 250/492.21 |
| 2009/0121149 A1* | 5/2009 | Radovanov | H01J 37/12 250/396 R |
| 2011/0114851 A1* | 5/2011 | Purser | G21K 1/093 250/396 R |
| 2011/0155921 A1* | 6/2011 | Kellerman | H01J 37/1477 250/396 R |
| 2015/0144810 A1* | 5/2015 | Sinclair | H01J 37/3171 250/505.1 |
| 2015/0228454 A1* | 8/2015 | Kato | H01J 37/3171 250/396 ML |
| 2015/0340202 A1* | 11/2015 | Matsushita | H01J 37/3171 250/492.21 |
| 2015/0371822 A1* | 12/2015 | Amano | H01J 37/244 250/397 |

* cited by examiner

PARALLELIZING ELECTROSTATIC ACCELERATION/DECELERATION OPTICAL ELEMENT

FIELD OF THE DISCLOSURE

The disclosure relates generally to techniques for manufacturing electronic devices, and more particularly, to techniques for controlling an ion beam using a parallelizing electrostatic acceleration/deceleration optical element.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties. For example, dopants may be introduced into an intrinsic semiconductor substrate to alter the type and level of conductivity of the substrate. In manufacturing an integrated circuit (IC), a precise doping profile provides improved IC performance. To achieve a desired doping profile, one or more dopants may be implanted in the form of ions in various doses and various energy levels.

Ion implantation systems may comprise an ion source and a series of beam-line components. The ion source may comprise a chamber where desired ions are generated. The ion source may also comprise a power supply and an extraction electrode assembly disposed near the chamber. The beam-line components, may include, for example, a mass analyzer, one or more analyzing magnets, a first acceleration or deceleration stage, a collimator, and a second acceleration or deceleration stage. The analyzing magnets select desired ion species, filter out contaminant species and ions having undesirable energies, and adjust ion beam quality at a target wafer. Suitably shaped electrodes may modify the energy and the shape of an ion beam. Much like a series of optical lenses for manipulating a light beam, the beam-line components can filter, focus, and manipulate ions or ion beam having desired species, shape, energy, and other qualities. The ion beam passes through the beam-line components and may be directed toward a substrate mounted on a platen or clamp. The substrate may be moved in one or more dimensions (e.g., translate, rotate, and tilt) in the beam to achieve the desired process results.

Significant changes in ion energies taking place in the optical elements of the beamline components may have a substantial impact on a shape of the ion beam. For example, a deceleration lens used for providing co-local deflection for filtering energetic neutrals, may face challenges associated with control of deflection angle and beam focus. Furthermore, voltage needed to control deflection of the ion beam may depend on the energy of the beam (e.g., input and output), whereas voltage to control focus of the ion beam may be varied to accommodate ion beams with different current and height. This may lead to difficulty in tuning the ion beam since tuning the size of the ion beam (focus) may not be readily feasible if a position of the ion beam also continues to vary. Still furthermore, conventional systems and methods do not provide independently control of the deflection and/or focus of the ion beam.

SUMMARY

In view of the foregoing, what is needed are systems and methods for controlling a charged particle beam using a series of electrodes including a plurality of different shapes.

In one approach, an electrostatic optical element includes a first set of (i.e., one or more) electrodes each having a first electrode shape for parallelizing and deflecting the charged particle beam, the first set of electrodes comprising at least one electrode having a convex shape and at least one electrode having a concave shape. The electrostatic optical element further includes a second set of electrodes adjacent the first set of electrodes for accelerating or decelerating the charged particle beam along a beamline, wherein the second set of electrodes each have an approximately cylindrical shape. In one approach, a power supply is electrically connected to each of the first and second sets of electrodes, the power supply arranged to enable independent voltage/current control.

An exemplary ion implantation system according to embodiments herein includes an ion source for generating a charged particle beam, and an electrostatic optical element receiving the charged particle beam along a beamline. The electrostatic optical element may include a series of electrodes arranged around the ion beam, the series of electrodes including a first set of electrodes having a first electrode shape for parallelizing and deflecting the charged particle beam, and a second set of electrodes adjacent the first set of electrodes. The second set of electrodes may have a second electrode shape for accelerating or decelerating the charged particle beam, and wherein the second electrode shape is different than the first electrode shape of the first set of electrodes. The system may further include a power supply electrically connected with the series of electrodes, the power supply arranged to enable independent control of a voltage and a current applied to each of the series of electrodes. Alternately, a power supply may be connected to a multiplicity of electrodes through a resistive network allowing different ratios of voltages to be applied to the electrode set.

An exemplary electrostatic optical element for controlling a charged particle beam according to embodiments herein includes a first set of electrodes each having a first electrode shape for parallelizing and deflecting the charged particle beam. The first set of electrodes may include at least one electrode having a convex shape and at least one electrode having a concave shape. The electrostatic optical element may further include a second set of electrodes adjacent the first set of electrodes for accelerating or decelerating the charged particle beam along a beamline, wherein the second set of electrodes each have an approximately cylindrical shape.

An exemplary method may including receiving a charged particle beam at an electrostatic optical element, wherein the electrostatic optical element includes a series of electrodes arranged around the charged particle beam, and parallelizing and deflecting the charged particle beam using a first set of electrodes having a first electrode shape. The method may further include accelerating or decelerating the charged particle beam using a second set of electrodes adjacent the first set of electrodes, wherein the second set of electrodes each have a second electrode shape different than the first electrode shape of the first set of electrodes. The method may further include providing a voltage to each of the series of electrodes from a power supply, the power supply configured to allow independent control of the voltage to each of the series of electrodes.

Figure 1A:
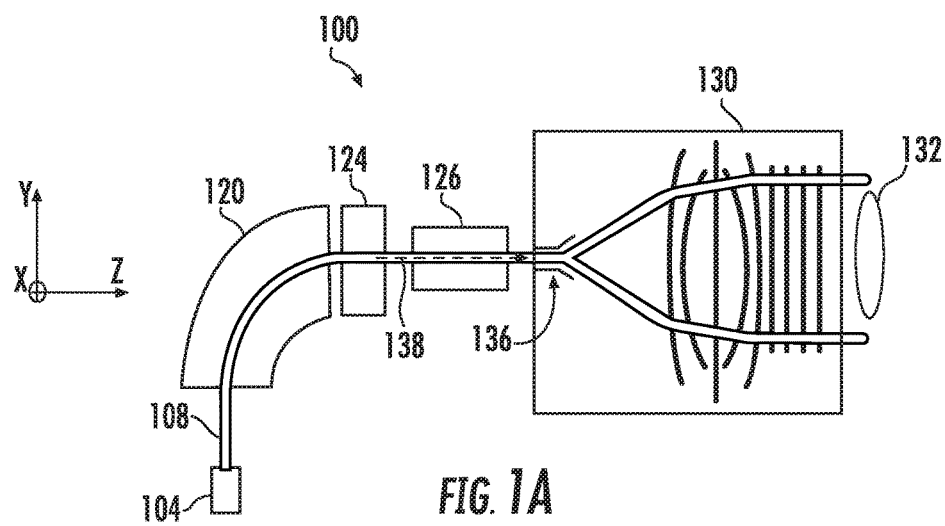
FIGS. 1A-B are schematic side and top views, respectively, illustrating an ion implantation system in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

A system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, each with respect to the geometry and orientation of a component of a semiconductor manufacturing device as appearing in the figures. The terminology will include the words specifically mentioned, derivatives thereof, and words of similar import. Furthermore, since gravity has a negligible effect on the trajectories of the ions in the embodiments described herein, those practiced in the art will recognize the system may be rotated to several different orientations and achieve the same effect.

As used herein, an element or operation recited in the singular and proceeded with the word "a" or "an" are understood as possibly including plural elements or operations, unless otherwise indicated. Furthermore, references to "one embodiment" of the present disclosure may be interpreted as including the existence of additional embodiments also incorporating the recited features.

As stated above, provided herein are approaches for controlling a charged particle beam using a series of electrodes including a plurality of different shapes. In one approach, an electrostatic optical element includes a first set of electrodes each having a first electrode shape for providing graded variation in an acceleration or deceleration field, the first set of electrodes comprising at least one electrode having a convex shape and at least one electrode having a concave shape. The electrostatic optical element further includes a second set of electrodes adjacent the first set of electrodes for accelerating or decelerating the charged particle beam along a beamline, wherein the second set of electrodes each have a cylindrical shape. In one approach, a power supply is electrically connected to each of the first and second sets of electrodes, the power supply arranged to enable independent voltage/current control.

As used herein, the electrostatic optical element is a lens or filter for parallelizing, deflecting, and accelerating or decelerating all in one optic. The electrostatic optical element may be used with an individual or double or more magnet geometry to construct an efficient ion implanter. Furthermore, the electrostatic optical element may operate with a scanned spot ion beam, as will be described in further detail below with respect to FIGS. 1A-B, or with a ribbon beam, as will be described in further detail below with respect to FIGS. 2A-B.

In general, ribbon beam or scanned spot beam ion implanters have a number of optical elements. These elements are used to take an extracted ion beam, analyze the ion beam for the appropriate mass, and then, in no particular order, parallelize the ion beam, accel/decel the ion beam to the final energy, and often deflect the ion beam to reduce or eliminate off energy ions or neutrals. Embodiments herein provide all these functions together within an individual optic having multiple electrodes of various shapes. The electrostatic optical element has an advantage of being relatively compact, and having a large degree of flexibility in terms of the position along the beamline of the various effects on the ion beam. The electrostatic optical element can also perform many of ion beam functions simultaneously.

More specifically, in exemplary embodiments, the electrostatic optical element includes specifically selected shapes positioned along the path of the beam. For example, in some embodiments one or more electrodes will be curved, for example, convex and/or concave, in a direction of the beamline, wherein these curved electrodes are primarily responsible for the collimation or parallelizing of the ion beam. The curved electrodes may also be positioned so as to bend the ion beam to provide filtering of neutrals and off-energy components.

Furthermore, in exemplary embodiments, the electrodes may be addressable with power supplies to affect acceleration/deceleration of the ion beam, for example, at the same time bending and parallelizing of the ion beam are taking place. Grading of the acceleration/deceleration allows independent control of deflection, acceleration/deceleration, and parallelization, thus enabling electrostatic control of the focal points of the ion beam.

Figure 1B:
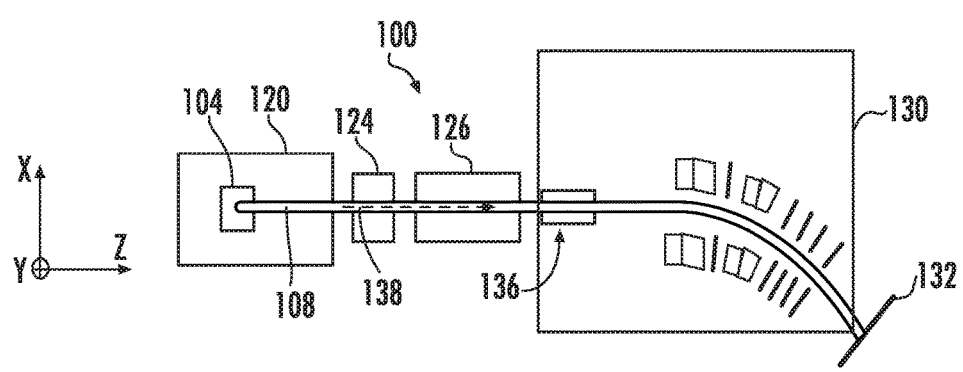

Referring now to FIGS. 1A-B, schematic side and top views, respectively, illustrate an ion implantation system for generating and controlling a scanned spot ion beam in accordance with embodiments of the present disclosure. The ion implantation system (hereinafter "system") 100 represents a process chamber containing, among other components, an ion source 104 for producing an ion beam 108, an ion implanter, and a series of beam-line components. The ion source 104 may comprise a chamber for receiving a flow of gas and generating ions. The ion source 104 may also comprise a power source and an extraction electrode assembly (not shown) disposed near the chamber. The beam-line components may include, for example, an analyzer magnet 120, a mass resolving slit (MRS) 124, a quadrupole component 126, and an electrostatic optical element (EOE) 130.

In exemplary embodiments, as will be further described below, the EOE 130 may filter, focus, and manipulate ions or the ion beam 108 to have a desired species, shape, energy, and other qualities. The ion beam 108 passing through the EOE 130 may be directed toward a substrate 132 mounted on a platen or clamp within a process chamber. The substrate may be moved in one or more dimensions (e.g., translate, rotate, and tilt). In this embodiment, the EOE 130 includes a scanner 136 positioned along a beamline 138 between the MRS 124 and the electrodes of the EOE 130. In other embodiments, the scanner 136 is located external to the EOE 130.

As used herein, the EOE 130 is a beam-line optic or filter configured to independently control parallelization, deflection, acceleration/deceleration, and focus of the ion beam 108. In one embodiment, as will be described in greater detail below, the EOE 130 may include an electrode configuration comprising a plurality of upper electrodes disposed above the ion beam 108 and a plurality of lower electrodes disposed below the ion beam 108. The plurality of upper electrodes and the plurality of lower electrodes may be stationary and have fixed positions. A difference in potentials between the plurality of upper electrodes and the plurality of lower electrodes may also be varied along the ion beam trajectory to take into account the energy of the ion beam at each point along the central ion beam trajectory for independently controlling deflection, acceleration/deceleration, and/or focus of the ion beam 108.

Figure 2A:
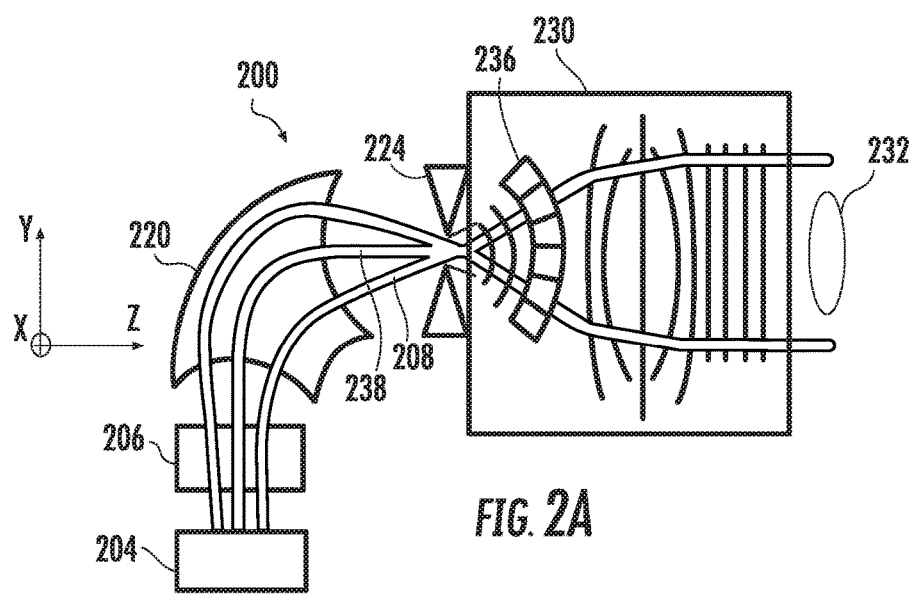
FIGS. 2A-B are schematic side and top views, respectively, illustrating an ion implantation system in accordance with embodiments of the present disclosure.
Figure 2B:
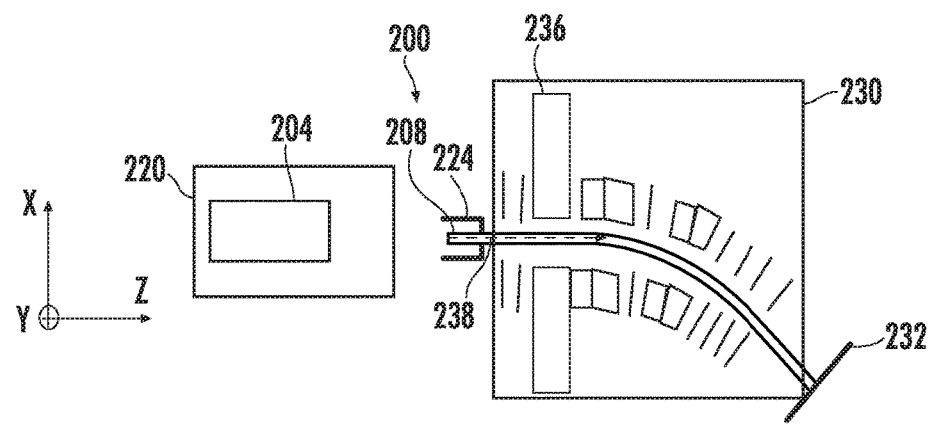

Referring now to FIGS. 2A-B, schematic side and top views, respectively, illustrate an ion implantation system for generating and controlling a ribbon beam in accordance with embodiments of the present disclosure. The ion implantation system (hereinafter "system") 200 represents a process chamber containing, among other components, an ion source 204 for producing an ion beam 208, extraction electrodes 206, and a series of beam-line components. The ion source 204 may comprise a chamber for receiving a flow of gas and generating ions. The ion source 204 may also comprise a power source and an extraction electrode assembly (not shown) disposed near the chamber. The beam-line components may include, for example, an analyzer magnet 220, a mass resolving slit (MRS) 224, and an electrostatic optical element (EOE) 230.

In exemplary embodiments, as will be further described below, the EOE 230 may filter, focus, and manipulate ions or the ion beam 208 to have a desired species, shape, energy, and other qualities. The ion beam 208 passing through the EOE 230 may be directed toward a substrate 232 mounted on a platen or clamp within a process chamber. The substrate may be moved in one or more dimensions (e.g., translate, rotate, and tilt). In this embodiment, the EOE 230 includes a multipole component 236 positioned along the beamline 238 between the MRS 124 and the electrodes of the EOE 230 for modifying the ion beam spot size, spot shape, and/or ion density of the analyzed ion beam 208 as the ion beam 208 traverses the beamline 238. In other embodiments, the multipole component 236 is located external to the EOE 230.

Similarly to above, the EOE 230 of FIGS. 2A-B is a beam-line optic or filter configured to independently control parallelization, deflection, acceleration/deceleration, and focus of the ion beam 208. In one embodiment, as will be described in greater detail below, the EOE 230 may include an electrode configuration comprising a plurality of upper electrodes disposed above the ion beam 208 and a plurality of lower electrodes disposed below the ion beam 208. The plurality of upper electrodes and the plurality of lower electrodes may be stationary and have fixed positions. A difference in potentials between the plurality of upper electrodes and the plurality of lower electrodes may also be varied along the ion beam trajectory to take into account the energy of the ion beam at each point along the central ion beam trajectory for independently controlling deflection, acceleration/deceleration, and/or focus of the ion beam 208.

Figure 3A:
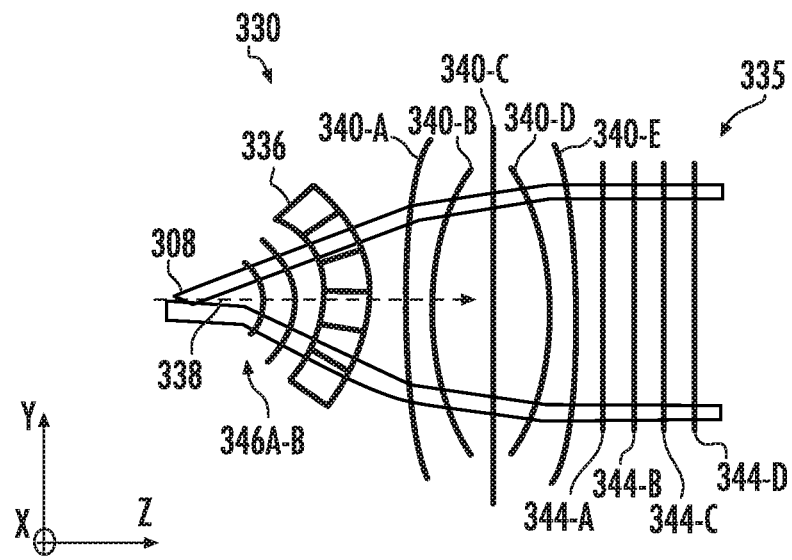
FIGS. 3A-B are schematic side and top views, respectively, illustrating electrostatic optical element of the implantation system of FIGS. 1-2 in accordance with embodiments of the present disclosure.
Figure 3B:
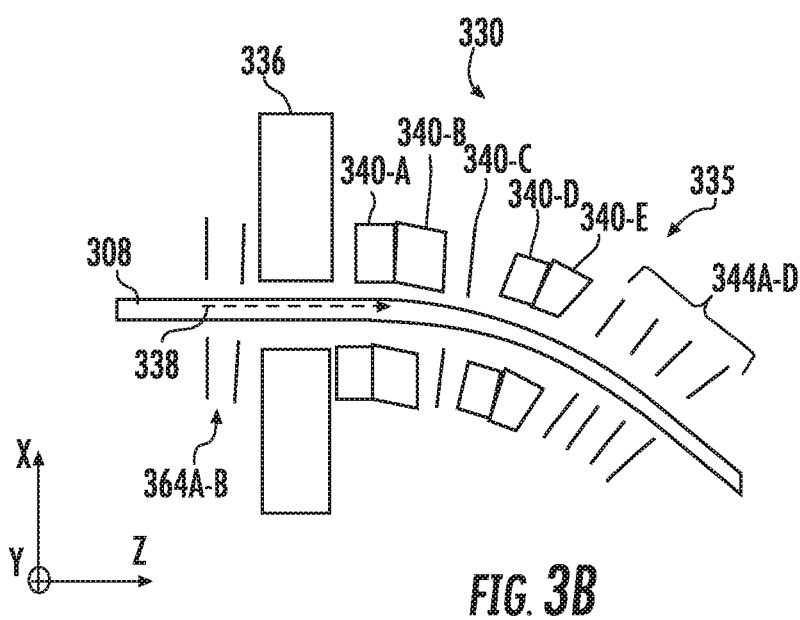

Referring now to FIGS. 3A-B, an exemplary electrostatic optical element according to embodiments of the disclosure will be described in greater detail. As shown, electrostatic optical element (EOE) 330 is similar to the EOE 130 shown in FIGS. 2A-B. However, embodiments herein are not limited by such. In this case, the EOE 330 includes a series of electrodes 335 including a first set of electrodes 340A-E having a first electrode shape for providing graded variation in an acceleration or deceleration field, the first set of electrodes 340A-E comprising at least one electrode have a convex shape and at least one electrode having a concave shape. For example, as shown, the electrodes 340A-B each have a convex profile curved towards the wafer 332 along the beamline 338, in the z-direction. The electrodes 340D-E each have a concave profile curved towards the multipole component 336 along the beamline 338, in the z-direction. An approximately straight cylindrical electrode 340-C separates the convex electrodes 340A-B from the concave electrodes 340D-E. In other embodiments, the electrode 340-C can have a planar shape.

As further shown, the EOE 330 further includes a second set of electrodes 344A-D adjacent the first set of electrodes 340A-E for accelerating or decelerating the ion beam 308 along the beamline 338, wherein the second set of electrodes 344A-D each have a straight cylindrical or planar shape. In some embodiments, the EOE 330 further includes a third set of electrodes 346A-B disposed along the beamline 338 adjacent the multipole component 336, as shown. The third set of electrodes 346A-B may represent a set of deceleration electrodes.

Together, the first set of electrodes 340A-E and the second set of electrodes 344A-D are series of selectively shaped optical elements to allow for graded variation the in accel/decel electric field, while parallelizing and deflecting the ion beam 308 for filtering of neutrals and off energy beam components. More specifically, the first set of electrodes 340A-E, having multiple curved electrodes, are primarily responsible for influencing collimation or parallelization of the ion beam 308, as the first set of electrodes 340A-E are positioned so as to bend the ion beam 308 down in the x-direction, and in doing so, providing filtering of neutrals and off energy components.

In some embodiments, the series of electrodes 335 is a graded lens configuration, wherein one or more of the first set of electrodes 340A-E represent a set of entrance electrodes and a set of suppression/focusing electrodes, and wherein one or more of the second set of electrodes 344A-D represent a set of exit electrodes. Each set of electrodes in the series of electrodes 335 may have a space/gap to allow the ion beam 308 (e.g., a ribbon beam) to pass therethrough. In some embodiments, the suppression electrode prevents upstream beam plasma electrons from being stripped from the ion beam 308. Between this suppression electrode and a final ground electrode, the energy of the beam is reduced according to the potentials on the remaining electrodes. This grading of the deceleration field affects the net focus of the beam, as well as the residual energy contamination (EC).

In some embodiments, these electrodes (e.g., the entrance electrode(s), the suppression/focusing electrode(s), and the exit electrode(s) may be provided in a housing, wherein one or more pumps may be directly or indirectly connected to the housing. In one embodiment, the pump(s) may be a vacuum pump for providing a high-vacuum environment or other controlled environment. In other embodiments, the housing may include one or more bushings used to electrically isolate the housing from other components. Other various embodiments may also be provided.

As shown in FIGS. 3A-B, the series of electrodes 335 may include two conductive pieces electrically coupled to each other or may be a one-piece structure with an aperture for the ion beam 308 to pass therethrough. In some embodiments, upper and lower portions of suppression/focusing electrodes may have different potentials (e.g., in separate conductive pieces) in order to deflect the ion beam 308 passing there through. For simplicity, each of the series of electrodes 335 may be referred to in the singular. Furthermore, although the graded lens configuration of FIGS. 3A-B is depicted as an eleven (11) element lens configuration (e.g., the first set of electrodes 340A-E, the second set of electrodes 344A-D, and the third set of electrodes 346A-B), any number of elements (or electrodes) may be utilized.

In some embodiments, the ion beam 308 passing through the series of electrodes 335 may include boron or other elements. Electrostatic focusing of the ion beam 308 may be achieved by using several thin electrodes (e.g., the suppression/focusing electrodes) to control grading of potential along the beamline 338. In the graded lens configuration shown, high deceleration ratios may also be provided while avoiding over-focusing.

As a result, use of the ion beam 308 may be employed in an energy range to enable higher quality beams, even for very low energy output beams. In one embodiment, as the ion beam 308 passes through the series of electrodes 335, the ion beam 308 may be decelerated from 6 keV to 0.2 keV and deflected at approximately 15° in the x-direction. In this non-limiting example, the energy ratio may be 30/1. Other various embodiments may also be provided.

Figure 4:
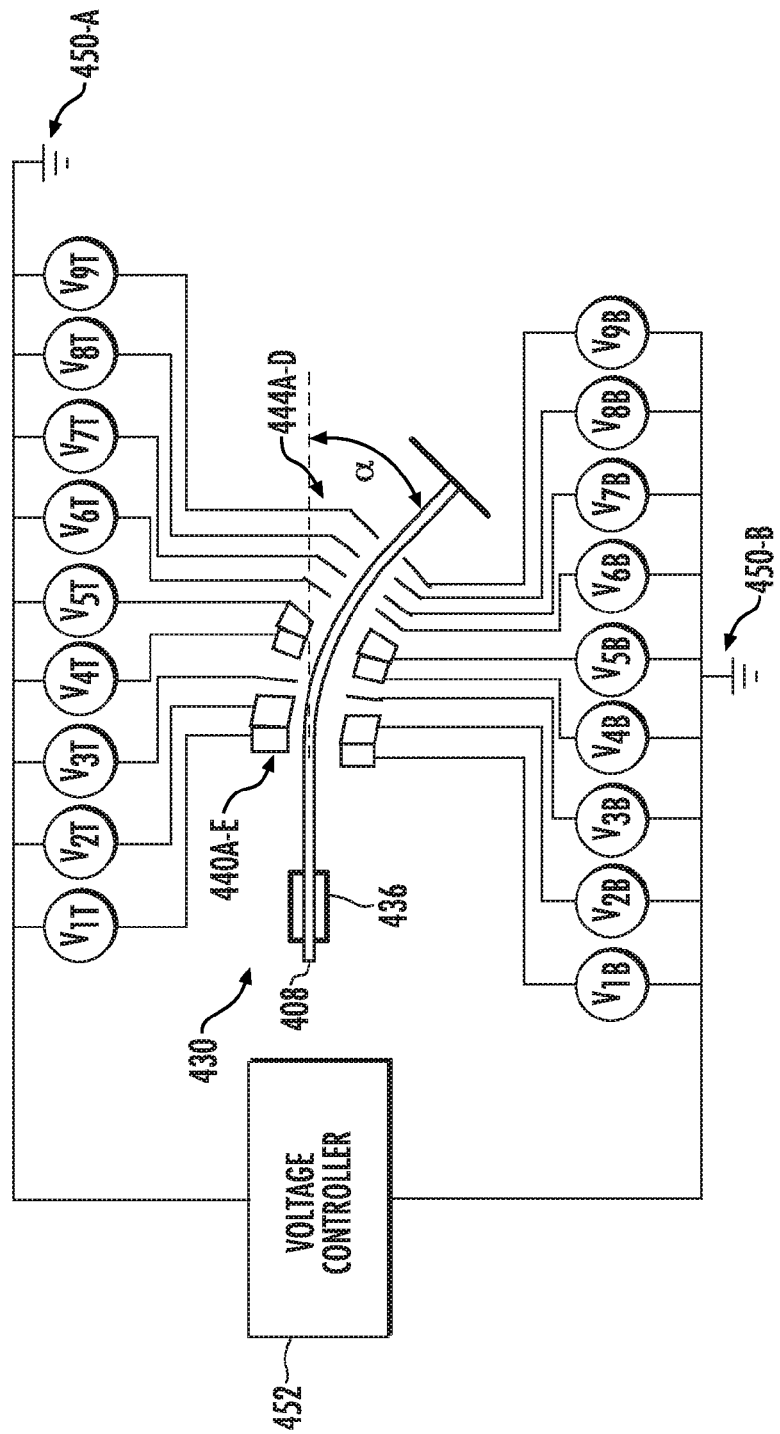
FIG. 4 is a schematic top view illustrating a power supply operating with the ion implantation systems shown in FIGS. 1A-3B in accordance with embodiments of the present disclosure.

Referring now to FIGS. 3-4, a power supply operating with the electrostatic optical element in accordance with embodiments of the present disclosure will be described. In this non-limiting embodiment, the EOE 430 is similar to the EOE 130 shown in FIGS. 1A-B. However, embodiments herein are not limited by such. In the exemplary embodiment shown, two power supplies 450A-B (e.g., DC power) supply a voltage and a current to each of the first set of electrodes 440A-E (e.g., $V_{1-5}$) and the second set of electrodes 444A-D (e.g., $V_{6-9}$). In various other embodiments, each electrode may include its own power supply per electrode, or the number of power supplies may be a lesser number, and provided with a resistor network for dividing voltage.

Each voltage connection $V_{1-9}$ is arranged in parallel to enable independent control to each of the first set of electrodes 440A-E and the second set of electrodes 444A-D. In various embodiments, the voltage and current provided by the power supplies 450A-B may be constant or varied, and may be controlled by a voltage controller 452 (e.g., a microcontroller or processor).

In some embodiments, the first set of electrodes 440A-E and the second set of electrodes 444A-D may be addressable to affect acceleration or deceleration of the ion beam 408, at the same time bending and the parallelizing of the ion beam 408 is taking place. In some embodiments, the electrode voltages may be varied together by the voltage controller 452 to achieve: (1) grading of the accel/decel to control ion beam focus; (2) centering of the ion beam's central ray trajectory (CRT) on the lens center line, (3) adjustment of the ion beam's final deflection angle; and (4) minimization of energy contamination. Variation of the voltages may be achieved while ensuring all electrode voltages remain negative with respect to the upstream beamline 438 to prevent electron currents.

Controlling this large number of power supplies is a significant controls challenge. An approach is therefore disclosed herein for combining these power supply controls to yield a small number of "virtual knobs" as will be further described below. Such a re-parameterization simplifies, and enables the control of, the EOE 430.

In one embodiment, assigning voltages to the electrodes of the EOE 430 involves several aspects. First, the accel/decel is graded, i.e., the energy of the ion beam's CRT is calculated along the beamline. Second, a deflection factor is calculated, wherein the deflection factor functions along the EOE 430 to achieve an angle correction (e.g., beyond the angle of the lens geometry). Third, the electrode voltages are calculated to achieve the graded deceleration and deflection with angle correction so the beam CRT remains close to lens center, whilst maintaining all voltages negative (relative to the downstream beamline).

More specifically, grading the acceleration/deceleration occurs between the suppression electrode(s) and the final ground electrode(s), wherein the energy of the beam is reduced according to the potentials on the intervening electrodes. This grading of the accel/decel field affects the net focus of the beam, as well as the residual energy contamination (EC). According to one embodiment, this grading is described by a power law, embodied by an individual parameter, α, as defined by Eq. 2 below.

$$E_{crt}(0) = E_0$$

$$E_{crt}(i = 1 \ldots 6) = E_f + (E_0 - E_f + eV_s)\left(\frac{(6-i)}{5}\right)^\alpha$$

Eq. 2

Thus, from Eq. 2, if α=1, the energy of the ions on the CRT varies linearly from $E_0+eV_s$ to $E_f$, whereas if α>1, the energy drops more quickly. In general, a large α decelerates the beam quickly, reducing the chance of high energy neutralized ions from reaching the wafer (i.e. resulting in low EC), and a small α results in greater focusing of the beam.

Next, deflection angle correction will be described in greater detail. The difference in voltage between the inner and outer electrodes provides an electric field perpendicular to the particle's motion, therefore producing a localized circular, or arcuate motion (see FIG. 7). The radius of curvature and length of the arc (and therefore the net deflection angle) will conform to the geometry of the lens in order for the beam to remain centered between the inner and outer electrodes, thus minimizing aberrations and the coupling between focus and deflection.

If $F_{defl}$ is constant over the length of the EOE 430, the ion beam's CRT would be perfectly circular, resulting in a net deflection angle θ over its length L. A desire of embodiments herein is to fine tune the net deflection angle to accommodate variations in ion beam alignment and effects of space-charge, while causing minimum deviation from this arcuate motion. According to one embodiment, this is done by adjusting the radius of curvature of the ion beam's deflection linearly along the length of the EOE 430. Thus the one (1) parameter $F_{defl}$ is replaced by two (2) parameters: the average value $f_{av}$ and the slope $\beta$ of $F_{defl}$, as shown in Eq. 3 below.

$$F_{defl}(z) = f_0 + \beta z \qquad \text{Eq. 3}$$

$$= f_{av} - \frac{\beta L}{2} + \beta z$$

At each point along the deflection path, the differential deflection is $$d\theta = \frac{F_{defl}}{2g_0} dz = \frac{1}{2g_0}(f_0 + \beta z)dz \qquad \text{Eq. 4}$$

Integrating this between $\theta$ and $z$ gives the net deflection $\theta(z)$ $$\theta(z) = \int_0^z \frac{1}{2g_0}(f_0 + \beta z')dz' = \frac{f_0}{2g_0}z + \frac{\beta}{4g_0}z^2 \qquad \text{Eq. 5}$$

The vertical displacement is related to the angular deflection by $$dy(z) = \tan(\theta(z))dz \qquad \text{Eq. 6}$$

$$y(z) = \int_0^z \left(\frac{f_0}{2g_0}z' + \frac{\beta}{4g_0}z'^2\right)dz' = \frac{f_0}{4g_0}z^2 + \frac{\beta}{12g_0}z^3$$

Thus at the exit of the lens (of length L)

$$\theta(L) = \frac{L}{2g_0}\left(f_0 + \frac{\beta L}{2}\right) = \frac{L}{2g_0}f_{av}, f_{av} = f_0 + \frac{\beta L}{2} \qquad \text{Eq. 7}$$

$$y(L) = \frac{L^2}{4g_0}\left(f_0 + \frac{\beta L}{3}\right) = \frac{L^2}{4g_0}f_{av} - \frac{L^3}{24g_0}\beta \qquad \text{Eq. 8}$$

In some embodiments, separating and independently controlling deceleration, deflection, and/or focus may be accomplished by: (1) maintaining symmetry of electrodes (e.g., the entrance electrodes, suppression/focusing electrodes, and the exit electrodes) with respect to a central ray trajectory ("CRT") of the ion beam 408, and (2) varying deflection voltages along the CRT of the ion beam 408 to reflect beam energy at each point along the CRT at a deflection angle, $\alpha$. By symmetry of the electrodes with respect to the CRT of the ion beam 408, the ends of upper and lower electrodes closest to the ion beam 408 may be maintained at equal (or near equal) perpendicular distances from the CRT of the ion beam 408 in other embodiments. For example, a difference in voltages on electrodes above and below the ion beam 408 (e.g., $V_{def}(z)=V_{upper}(z)-V_{lower}(z)$) may be configured so a deflection component of the electric field (e.g., $(V_{upper}(z)-V_{lower}(z))/\text{gap}(z)$) may be a fixed ratio/factor of the beam energy at a particular point (may vary along the electrodes or lenses) (e.g., factor*$E_{beam}(z)$). For example, this may be expressed as Equation 9 below:

$$V_{defl}(z)/\text{gap}(z) = \text{factor}*E_{beam}(z) \qquad \text{Eq. 9}$$

In some embodiments, this deflection voltage may be applied anti-symmetrically above and/or below (e.g., $+/-V_{defl}(z)$) relative to the potential at the CRT at the particular z). In other embodiments, for example, the deflection voltage may be applied to just one side of the ion beam 408 with twice the deflection voltage. Since the relationship between the top and bottom electrode voltage may be fixed for a given geometry, this relationship may be implemented in a circuit network or other similar network. Accordingly, a need for doubling the number of power supplies and/or fixing this relationship in hardware may be reduced, if not completely eliminated. Other various embodiments may also be provided, including other graded lens configurations.

Furthermore, for a specified input beam to the EOE 430, and specified energy deceleration of the EOE 430, the power supplies 450A-B controlling the potentials (V1-9) on the electrodes 440A-E and 444A-D within the EOE 430 control the focus and deflection of the ion beam 408. According to one embodiment, these power supplies are controlled by the following "virtual knobs":

(1) $\alpha$—controls the beam's focus, as well as residual energy contamination;

(2) $V_S$—controls the upstream electron suppression, preventing electrons from being stripped from the upstream beam;

(3) $f_0$—controls the deflection of the beam, used to center the beam at the exit of the lens (with $\theta_{cor}=0$); and (4) $\theta_{cor}$—provides fine-tune of the final deflection angle of the beam while constraining the position at the exit of the lens.

Apparatus for Centering Beam at Exit of Deflect Lens

In some embodiments, the virtual knobs may be tuned, wherein the accel/decel ratio, $\alpha$, and $V_s$, are set to achieve the desired energy, current, and focus of the final beam. The $F_0$ parameter may be set to achieve a centered beam at the exit of the EOE 430. This may be done by tuning $F_0$ while discerning the vertical position of the beam at the exit of the EOE 430 using, for example, current sensors on the final ground electrode(s) or a centered light sensor. Once this is done, the ion beam 408 can then be centered at the wafer plane using $\theta_{cor}$ (e.g., with vertical position constrained at the exit of EOE 430). This ensures the ion beam 408 is centered at the exit of the EOE 430, and the EOE 430 is excited at the correct/intended angle (i.e., the bend angle the beamline is set). The centering of the ion beam 408 at the wafer plane is accomplished using a two-dimensional profiler, or other known technique for sensing the vertical position of the ion beam 408.

In some embodiments, the parameter $\theta_{cor}$ (with constrained position at exit of EOE 430) may be used to tune the position of the ion beam 408 even if the vertical position of the ion beam 408 is not directly discerned at the exit of the EOE 430. Two parameters are measured to be able to set $\theta_{cor}$ and $F_0$ to their optimal values. In this approach, the ion beam's average vertical position Y and average vertical angle Y' are measured at the wafer plane. The response or sensitivities of these parameters to varying $\theta_{cor}$ and $F_0$ may be linear.

In another embodiment, the deceleration ratio, $\alpha$, and $V_s$, are set to achieve the desired energy, current, and focus of the final beam. $F_0$ is then tuned to achieve a centered beam at the wafer plane (accomplished using a two-dimensional profiler, or other known means of sensing the vertical position of the beam). The angle of the ion beam 408 can then be tuned at the wafer plane to be the specified bend angle by varying $\theta_{cor}$ (with vertical position constrained at the wafer plane). This ensures the ion beam is centered at the exit of the EOE 430 and exiting the EOE 430 at the correct angle.

The approaches disclosed herein are not limited in application to any one specific lens geometry. The teachings herein can be applied to applications using a variety of different lens geometries. For example, for any electrostatic lens combining deceleration and deflection, whether there is an individual or a multiplicity of bends, the beam may remain centered at the exit of the lens (where the focus is the largest) to (1) minimize aberrations, (2) reduce interaction between angle adjustment and focus, and (3) maintain consistent tuning, resulting in consistent residual energy contamination.

Figure 5:
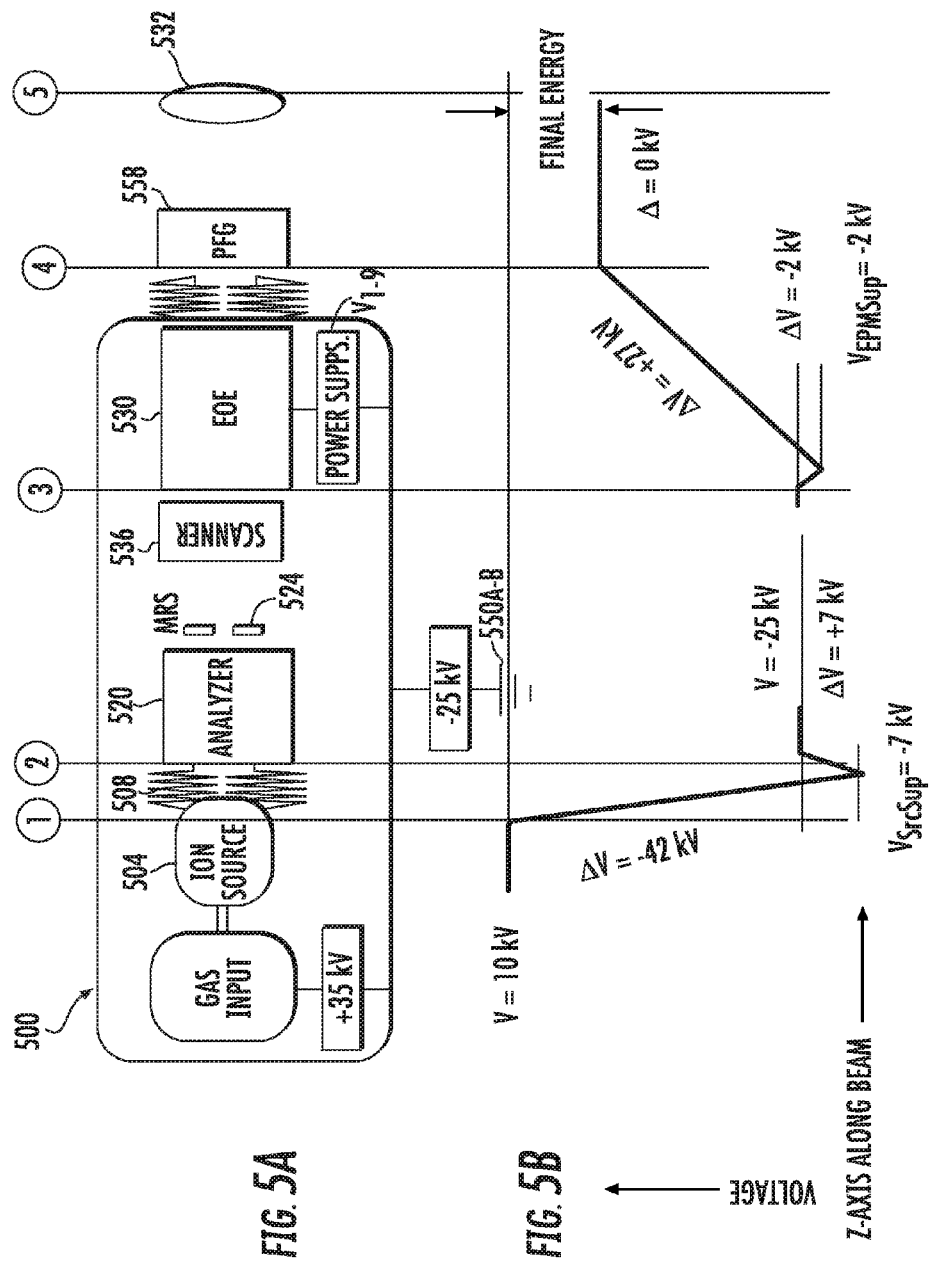
FIG. 5A is a schematic of an ion implantation system configured to deaccelerate a charged particle beam in accordance with embodiments of the present disclosure.
FIG. 5B is a graph illustrating the deceleration of the charged particle beam in the ion implantation system of FIG. 5A in accordance with embodiments of the present disclosure.

Referring now to FIGS. 5A-B, provided is an ion implantation system in a deceleration mode. As shown, FIG. 5A is a top schematic view of an ion beam implantation system 500 (hereinafter "system"), and FIG. 5B demonstrates corresponding voltage levels graphed at selected points (1)-(5) along the system 500. For example, in this non-limiting embodiment, the system 500 is held at a voltage of −25 kV, with respect to ground, the ion source 504 (1) is held at +35 kV with respect to the rest of the system 500, there is a variable electron suppression voltage −7 kV in this case, to keep electrons generated in the beamline from back streaming to the source and causing problems (e.g., glitching, high current loads, radiation, etc.), this suppression region ends before the analyzer magnet 520. Between points (2) and (3), the ion beam 508 traverses from the analyzer magnet 520 through the MRS 524 and the scanner 536, and the beam propagates as a 35 kV extracted beam. The ion beam 508 passes into the EOE 530, here is another electron suppression field, initially decreasing the voltage by 2 kV, thus increasing the ion energy. The ion beam then traverses the EOE 530, where the ion beam loses the energy gained from the suppression plus the voltage the system 500 is being held at, −25 kV with respect to ground, in this case. The ion beam is then delivered to a plasma flood gun (PFG) 558 at point (4). As shown, the voltage increases a net amount of 25 kV between points (3) and (4), this is the deceleration of the ion beam, reaching a final ion energy 10 keV, at ground potential 0 kV with respect to ground, at the wafer 532 (5).

Figure 6:
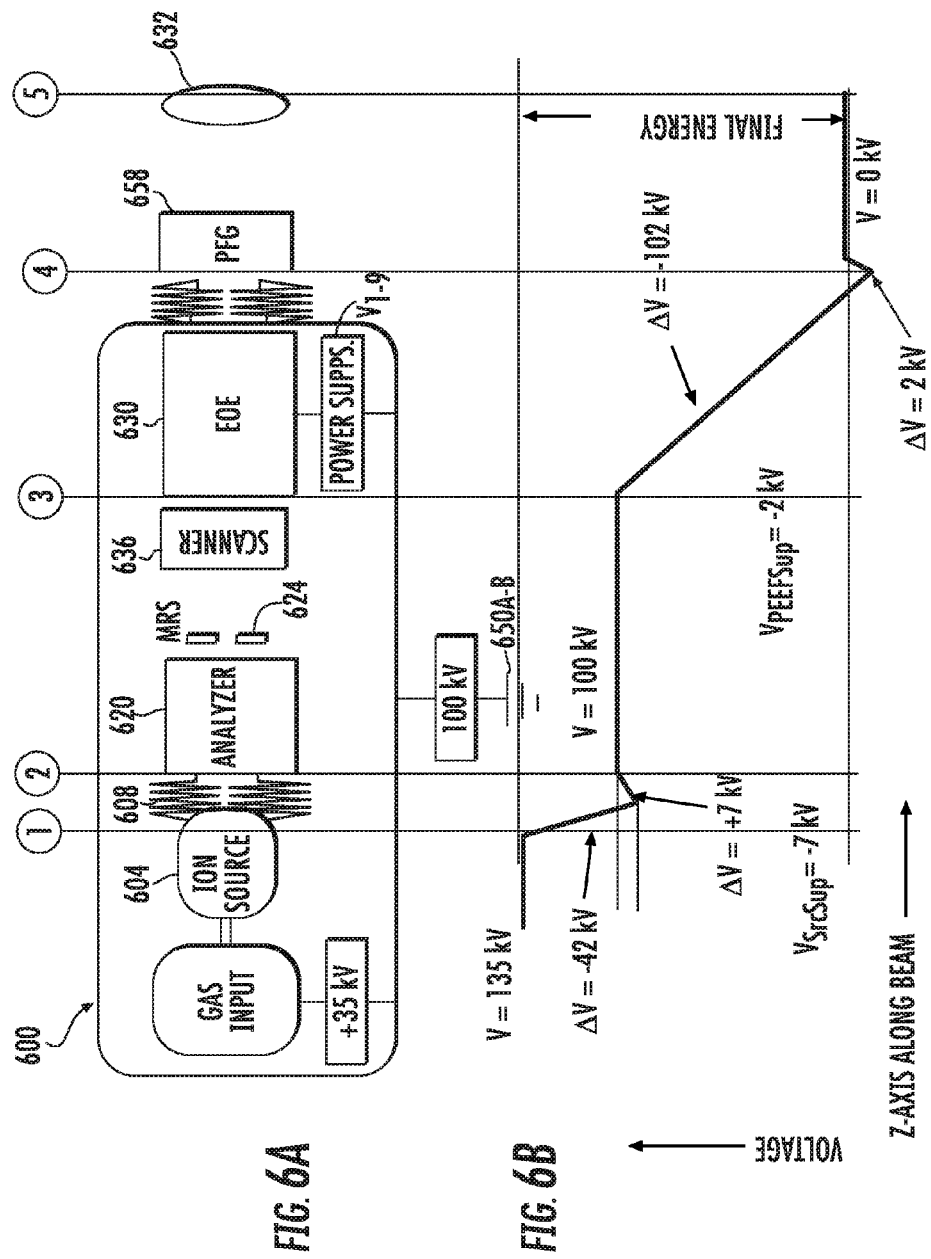
FIG. 6A is a schematic of an ion implantation system configured to accelerate a charged particle beam in accordance with embodiments of the present disclosure.
FIG. 6B is a graph illustrating the acceleration of the charged particle beam in the ion implantation system of FIG. 6A in accordance with embodiments of the present disclosure.
Figure 7:
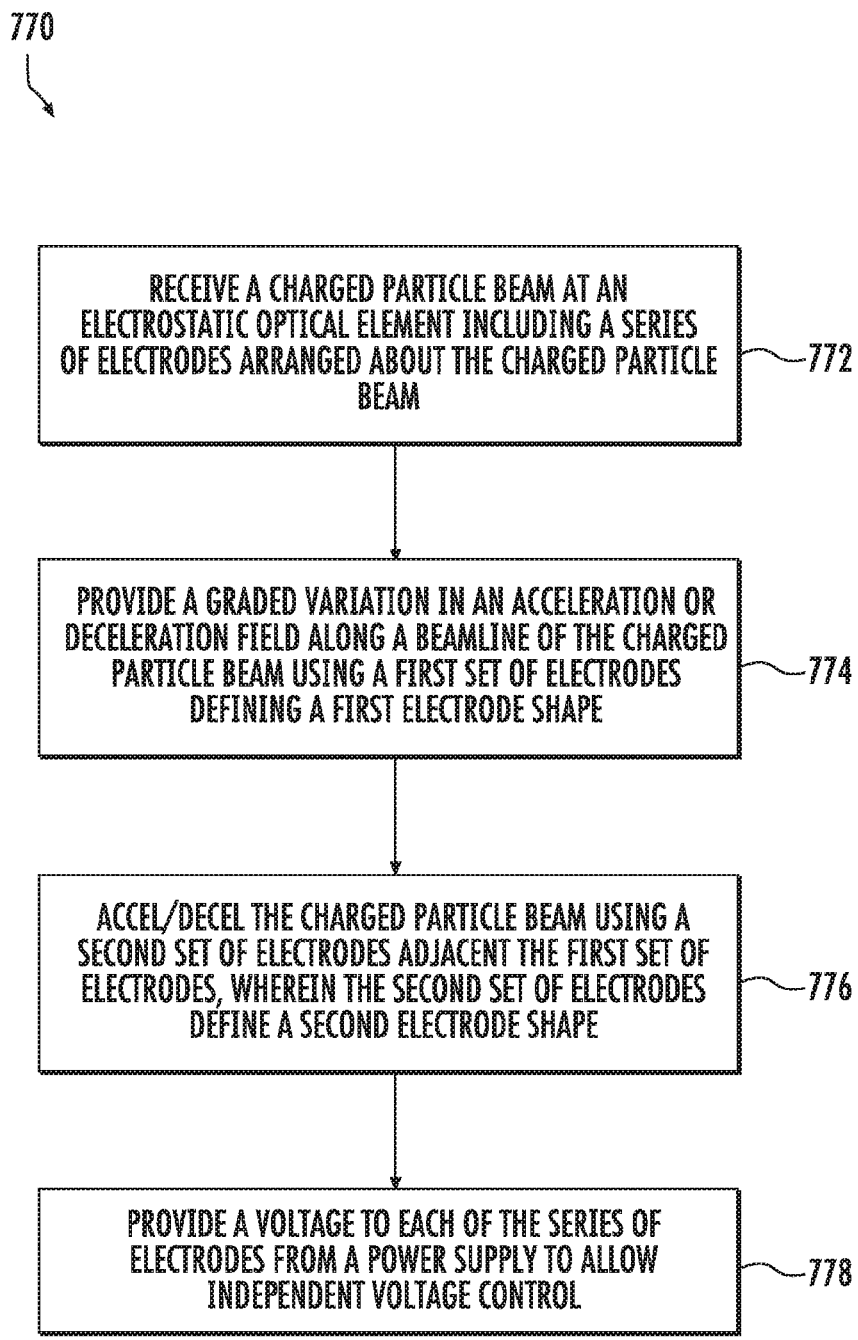
FIG. 7 is a flowchart illustrating an exemplary method in accordance with embodiments of the present disclosure.

Referring now to FIGS. 6A-B, provided is an ion implantation system in an acceleration mode. As shown, FIG. 6A is a top schematic view of an ion beam implantation system 600 (hereinafter "system"), and FIG. 6B demonstrates corresponding voltage levels graphed at selected points (1)-(5) along the system 600. For example, in this non-limiting embodiment, the system 600 initially has a voltage of 100 kV, with respect to ground. The ion source 604 (1) is held at 35 kV with respect to the system 600, there is a variable electron suppression voltage −7 kV in this case, to keep electrons generated in the beamline from back streaming to the source and causing problems, (glitching, high current loads, radiation, etc.) this suppression region ends before the analyzer magnet 620 (2). Between points (2) and (3), the ion beam 608 traverses from the analyzer magnet 620 through the MRS 624 and the scanner 636, propagating as a beam with 35 kV per unit charge, and maintains a voltage of +100 kV, with respect to ground. Between points (3) and (4), the ion beam 608 passes through the EOE 630, where the ions are accelerated by 100 kV per unit charge until the ion beam 608 reaches the PFG 668 (4), reaching a final ion energy 135 kV per unit charge, at ground potential, 0 kV with respect to ground, at the wafer 632 (5). Referring now to FIG. 7, a flow diagram illustrating an exemplary method 770 for controlling a charged particle beam using a series of electrodes including a plurality of different shapes in accordance with the present disclosure is shown. The method 770 will be described in conjunction with the representations shown in FIGS. 1-6.

The method 770 includes receiving a charged particle beam at an electrostatic optical element, as shown in block 772. In some embodiments, the electrostatic optical element includes a series of electrodes arranged around the charged particle beam. In some embodiments, the charged particle beam is an ion beam along a beamline. In various embodiments, the ion beam is a ribbon beam or a spot beam. In some embodiments, the charged particle beam is received from an ion source at a magnet analyzer disposed along the beamline. In some embodiments, the charged particle beam is received from the magnet analyzer at a mass resolving slit disposed along the beamline.

The method 770 further includes providing a graded variation in an acceleration or deceleration field along a beamline of the charged particle beam using a first set of electrodes having a first electrode shape, as shown in block 774. In some embodiments, the first set of electrodes comprises one or more electrodes having a convex shape relative to a direction of the beamline and one or more electrodes having a concave shape relative to the direction of the beamline. In some embodiments, the one or more electrodes having a concave shape and the one or more electrodes having a convex shape are separated by an approximately straight cylindrical electrode.

The method 770 further includes accelerating or decelerating the charged particle beam using a second set of electrodes adjacent the first set of electrodes, as shown in block 776. In some embodiments, the second set of electrodes each having a second electrode shape different than the first electrode shape of the first set of electrodes. In some embodiments, the second electrode shape is a straight cylindrical rod. In some embodiments, the charged particle beam is provided from the first set of electrodes to the second set of electrodes. In some embodiments, the second set of electrodes is positioned along the beamline between the first set of electrodes and a wafer.

Method 770 further includes providing a voltage to each of the series of electrodes from a power supply, as shown in block 778. In some embodiments, the power supply is configured to allow independent control of the voltage to each of the series of electrodes.

In view of the foregoing, at least the following advantages are achieved by the embodiments disclosed herein. Firstly, unlike prior art approaches providing disparate elements spread along a beamline, each providing a separate function, the electrostatic optical element provided herein includes multiple electrodes of various shapes to perform all these functions. Thus, the electrostatic optical element can perform many of these functions simultaneously. Secondly, the electrostatic optical element has the advantage of being relatively compact, as well as having a large degree of flexibility in terms of the position along the beamline to achieve various effects on the ion beam.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An ion implantation system, comprising:
an ion source for generating an ion beam;

an electrostatic optical element receiving the ion beam along a beamline, wherein the electrostatic optical element includes a series of electrodes arranged around the ion beam, wherein the series of electrodes includes a series of upper electrodes above the ion beam and a series of lower electrodes below the ion beam, and wherein the series of electrodes comprises:
  a first set of electrodes including both upper electrodes from the series of upper electrodes and lower electrodes from the series of lower electrodes, the first set of electrodes including a first electrode shape for parallelizing and deflecting the ion beam, the first set of electrodes including a plurality of electrodes having a convex shape with respect to the beamline and a plurality of electrodes having a concave shape with respect to the beamline; and
  a second set of electrodes directly adjacent the first set of electrodes in the series of electrodes, the second set of electrodes including both upper electrodes from the series of upper electrodes and lower electrodes from the series of lower electrodes, wherein the second set of electrodes includes a plurality of generally straight cylindrical electrodes, wherein the second set of electrodes includes an arrangement for accelerating or decelerating the ion beam, and wherein the first set of electrodes and the second set of electrodes are contained within a same electrically isolated housing; and
a power supply electrically connected with the series of electrodes, the power supply arranged to enable independent control of a voltage and a current applied to each electrode of the first and second sets of electrodes by electrically connecting each of the series of upper electrodes in parallel with a first power supply, and by electrically connecting each of the series of lower electrodes in parallel with a second power supply.

2. The ion implantation system of claim 1, further comprising:
  a magnet analyzer disposed along the beamline for receiving the ion beam from the ion source; and
  a mass resolving slit disposed along the beamline for receiving the ion beam from the magnet analyzer.

3. The ion implantation system of claim 2, further comprising:
  a quadrupole component disposed along the beamline for receiving the ion beam from the mass resolving slit; and
  a scanner positioned between the quadrupole component and the series of electrodes.

4. The ion implantation system of claim 2, the electrostatic optical element further comprising a multipole component disposed along the beamline.

5. The ion implantation system of claim 4, the electrostatic optical element further comprising a third set of electrodes disposed along the beamline between the multipole and the first set of electrodes.

6. The ion implantation system of claim 1, the first set of electrodes further providing graded variation in an acceleration or deceleration field.

7. The ion implantation system of claim 1, the first set of electrodes comprising a generally straight cylindrical electrode separating the plurality of electrodes having a convex shape and the plurality of electrodes having a concave shape.

8. The ion implantation system of claim 1, wherein the second set of electrodes is positioned along the beamline between the first set of electrodes and a wafer.

* * * * *